(12) United States Patent
Tseng (10) Patent No.: US 7,494,146 B2
(45) Date of Patent: Feb. 24, 2009

(54) BICYCLE FRAME

(75) Inventor: Ting-Huang Tseng, Changhua Hsien (TW)

(73) Assignee: Merida Industry Co., Ltd., Meikang Village, Tatsun Hsiang, Changhua Hsien (TW)

( * ) Notice: Subject to any disclaimer, the term of this patent is extended or adjusted under 35 U.S.C. 154(b) by 164 days.

(21) Appl. No.: 11/729,784

(22) Filed: Mar. 30, 2007

(65) Prior Publication Data

US 2008/0238030 A1    Oct. 2, 2008

(51) Int. Cl.
*B62K 3/02* (2006.01)
(52) U.S. Cl. .................................................... 280/284
(58) Field of Classification Search .............. 280/284, 280/283, 285, 286
See application file for complete search history.

(56) References Cited

U.S. PATENT DOCUMENTS 5,628,524 A * 5/1997 Klassen et al. .............. 280/284
6,843,494 B2 * 1/2005 Lam ............................ 280/284
7,392,999 B2 * 7/2008 O'Connor ................... 280/284
2007/0246909 A1 * 10/2007 Weng .......................... 280/284
2008/0238031 A1 * 10/2008 Tseng ......................... 280/284
2008/0252040 A1 * 10/2008 Colegrove et al. .......... 280/284
2008/0258427 A1 * 10/2008 Buckley ...................... 280/284

* cited by examiner

Primary Examiner—Tony H. Winner
(74) Attorney, Agent, or Firm—Muncy, Geissler, Olds & Lowe PLLC (57) ABSTRACT

A bicycle frame has a front frame, a mounting bracket assembly, a rear frame and a shock absorbing device. The front frame has a head tube, a down tube, a top tube, a bottom bracket shell and a seat tube. The seat tube is connected to bottom bracket shell, is connected to the rear end of the top tube and has an upper bracket seat, a connecting bracket and a lower bracket seat. The mounting bracket assembly is connected pivotally to the front frame and has two front mounting brackets and a rear mounting bracket. The rear frame is connected pivotally to the mounting bracket assembly and the front frame and has an upper fork, a lower fork and two dropouts. The shock absorbing device is connected to the front frame, the rear frame and the mounting bracket assembly and has a first shock absorber and a second shock absorber.

18 Claims, 6 Drawing Sheets

BICYCLE FRAME

BACKGROUND OF THE INVENTION

1. Field of the Invention

The present invention relates to a frame, and more particularly to a frame for a bicycle that has a shock absorbing device to provide a smooth operation.

2. Description of Related Art

Figure 6:
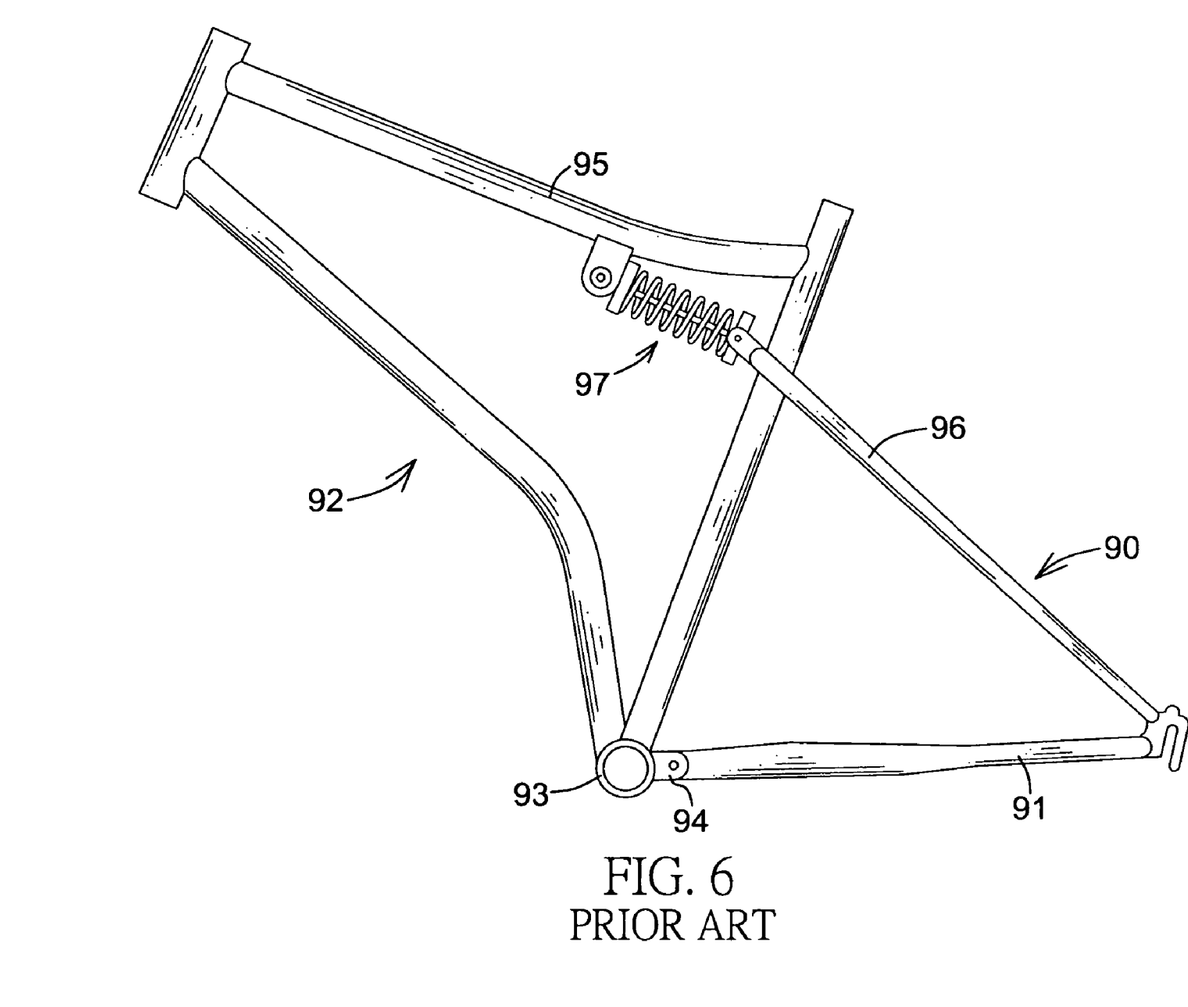
FIG. 6 is a side view of a conventional bicycle frame in accordance with the prior art.

With reference to FIG. 6, a conventional bicycle frame with a shock absorbing capability has a front frame (92), a rear frame (90) and a shock absorber (97).

The front frame (92) has a seat tube, a top tube (95) and a bottom bracket shell (93). The seat tube has an upper end and a lower end. The top tube (95) is connected securely to the seat tube near the upper end and has a mounting bracket. The mounting bracket is formed down on the top tube (95) near the seat tube. The bottom bracket shell (93) is connected securely to the lower end of the seat tube and has a connecting bracket (94). The connecting bracket (94) is formed on the bottom bracket shell (93) below the seat tube.

The rear frame (90) is connected pivotally to the front frame (92) and has a lower fork (91) and an upper fork (96). The lower fork (91) is connected pivotally to the bottom bracket shell (93) of the front frame (92) and has a front end and a rear end. The front end of the lower fork (91) is connected to the connecting bracket (94) of the bottom bracket shell (93). Accordingly, the lower fork (91) can move pivotally relative to the bottom bracket shell (93). The upper fork (96) is connected securely to the lower fork (91) and has a lower end, an upper end and a mounting wing. The lower end of the upper fork (96) is connected securely to the rear end of the lower fork (91). The mounting wing is connected to the upper end of the upper fork (96).

The shock absorber (97) is attached pivotally to the front frame (92) and the rear frame (90) between the top tube (95) and the upper fork (96) and has a connecting post and a spring. The connecting post is connected to the mounting bracket of the top tube (95) and the mounting wing of the upper fork (96). The spring is mounted around the connecting post to provide a shock absorbing capability between the front frame (92) and the rear frame (90).

However, the conventional bicycle frame has the following shortcomings.

1. The conventional bicycle frame can provide a shock absorbing capability, but the shock absorbing capability of the conventional bicycle frame is limited, and this cannot provide the conventional bicycle frame to fit with all kinds of the rugged and rough grounds.

2. The shock absorbing capability of the conventional bicycle frame isn't well enough to absorb the shock from the ground, and this will influence the safety and the comfortability of riding the bicycle.

To overcome the shortcomings, the present invention provides a bicycle frame to mitigate or obviate the aforementioned problems.

SUMMARY OF THE INVENTION

The main objective of the present invention is to provide a bicycle frame with a shock absorbing device that provides a smooth operation.

The bicycle frame in accordance with the present invention has a front frame, a mounting bracket assembly, a rear frame and a shock absorbing device. The front frame has a head tube, a down tube, a top tube, a bottom bracket shell and a seat tube. The seat tube is connected to bottom bracket shell, is connected to the rear end of the top tube and has an upper bracket seat, a connecting bracket and a lower bracket seat. The mounting bracket assembly is connected pivotally to the front frame and has two front mounting brackets and a rear mounting bracket. The rear frame is connected pivotally to the mounting bracket assembly and the front frame and has an upper fork, a lower fork and two dropouts. The shock absorbing device is connected to the front frame, the rear frame and the mounting bracket assembly and has a first shock absorber and a second shock absorber.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
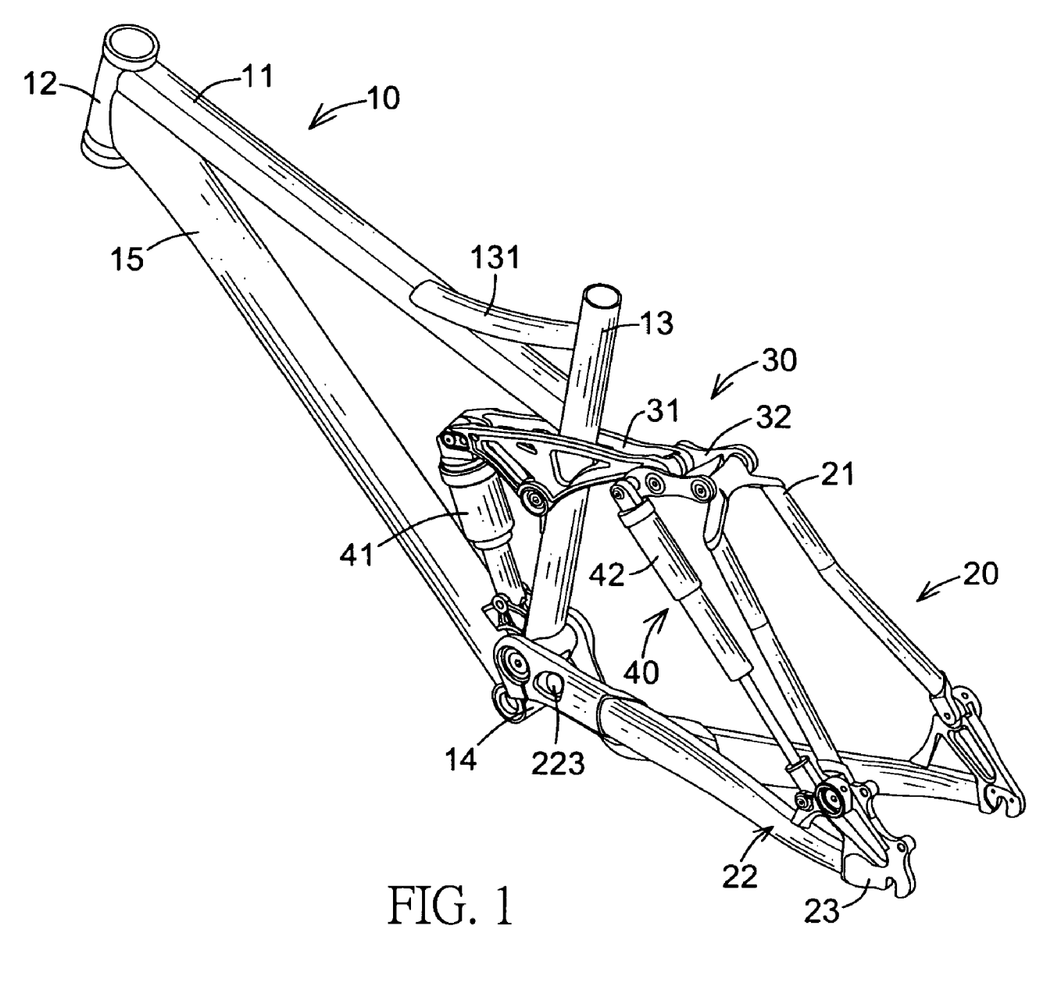
FIG. 1 is a perspective view of a bicycle frame in accordance with the present invention.
Figure 2:
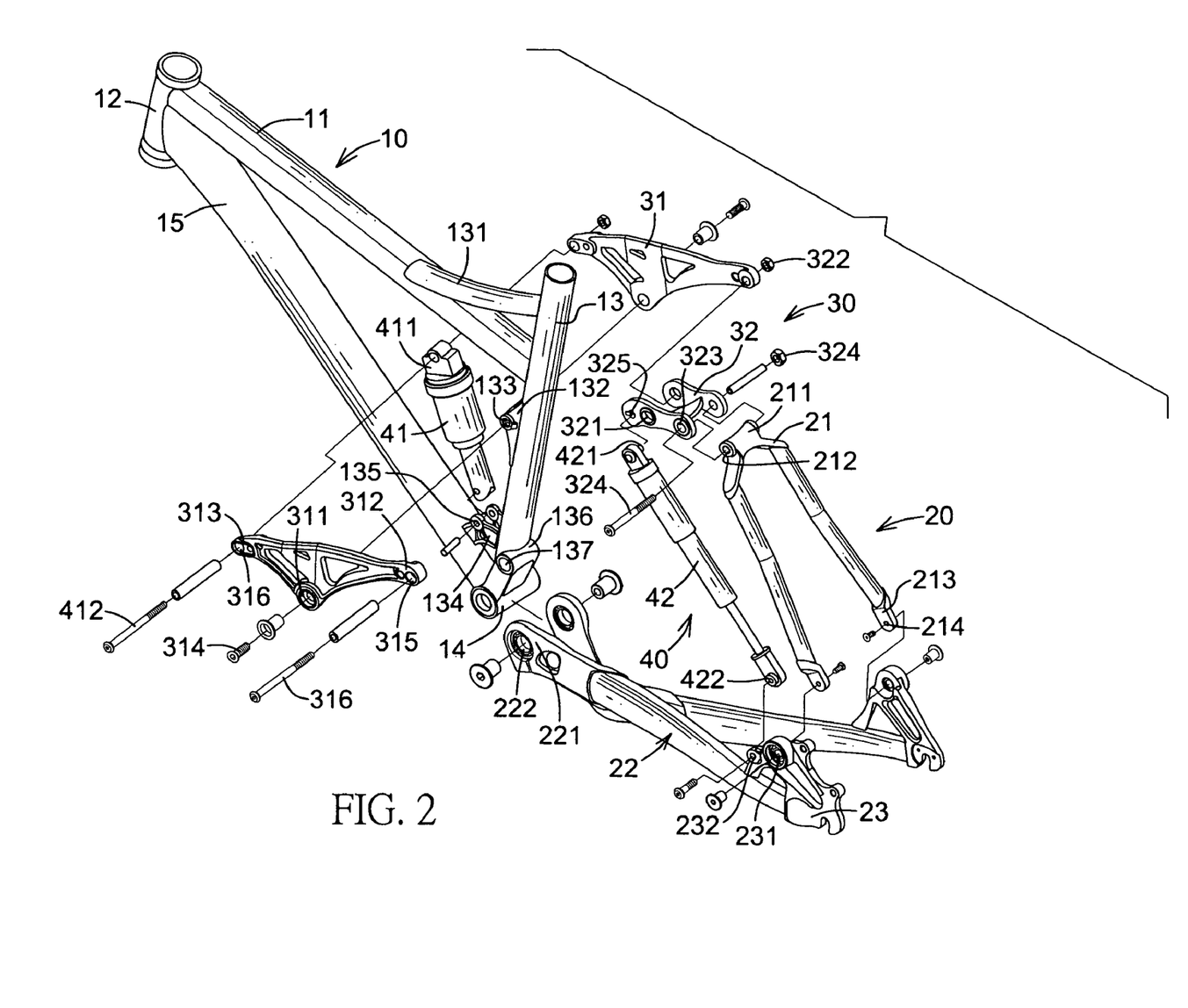
FIG. 2 is an exploded perspective view of the bicycle in FIG. 1.
Figure 3:
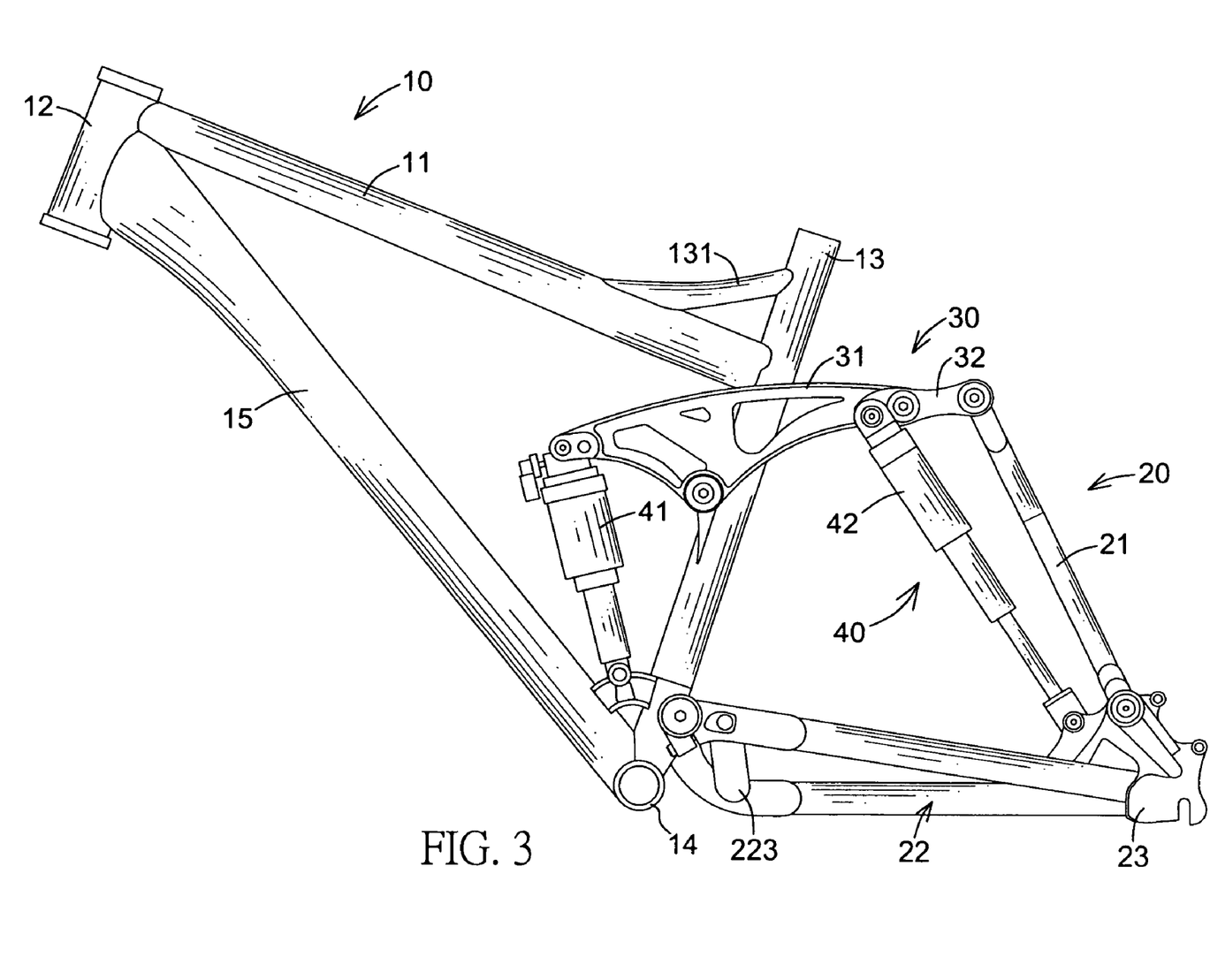
FIG. 3 is a side view of the bicycle frame in FIG. 1.

With reference to FIGS. 1 to 3, a bicycle frame in accordance with the present invention comprises a front frame (10), a mounting bracket assembly (30), a rear frame (20) and a shock absorbing device (40).

The front frame (10) has a front, a rear, a head tube (12), a down tube (15), a top tube (11), a bottom bracket shell (14) and a seat tube (13).

The head tube (12) is formed at the front of the front frame (10).

The down tube (15) is connected to and protrudes at an angle down from the head tube (12) toward the rear of the front frame (10) and has a bottom end.

The top tube (11) is substantially horizontal, is connected to and protrudes substantially horizontally from the head tube (12) toward the rear of the front frame (10) and has a rear end.

The bottom bracket shell (14) is connected transversally to the bottom end of the down tube (15) and has a top.

The seat tube (13) is connected to and protrudes up from the bottom bracket shell (14), is connected to the rear end of the top tube (11) and has an upper end, a lower end, a connecting stay (131), an upper bracket seat (132), a connecting bracket (134) and a lower bracket seat (136). The connecting stay (131) is formed on and protrudes forward from the seat tube (13) near the upper end and is connected to the top tube (11). The upper bracket seat (132) is formed on and protrudes forward from the seat tube (13) and has two sides and an upper pivot hole (133). The upper pivot hole (133) is formed transversally through the sides of the upper bracket seat (132). The connecting bracket (134) is formed on the seat tube (13), is connected to the down tube (15) over the bottom bracket shell (14) and has two sides and two connecting holes (135). The connecting holes (135) are respectively formed through the sides of the connecting bracket (134) and align with each other. The lower bracket seat (136) is formed on and protrudes forward from the seat tube (13) between the connecting bracket (134) and the bottom bracket shell (14) and has two sides and a lower pivot hole (137). The lower pivot hole (137) is formed transversally through the sides of the lower bracket seat (136).

The mounting bracket assembly (30) is connected pivotally to the front frame (10) and has two front mounting brackets (31) and a rear mounting bracket (32).

The front mounting brackets (31) may be triangular and are connected pivotally to the seat tube (13), and each front mounting bracket (31) has a front end, a rear end, a through hole (311), a fastener (314), a rear arm (312), a connecting hole (315), a front arm (313) and multiple mounting hole (316).

The through holes (311) are respectively formed through the front mounting brackets (31) and are aligned with the upper pivot hole (133) of the upper bracket seat (132).

The fasteners (314) extend through the through holes (311) in the front mounting brackets (31) and the upper pivot hole (133) in the upper bracket seat (132) to connect the front mounting brackets (31) to the seat tube (13).

The rear arms (312) are formed respectively at the rear ends of the front mounting brackets (31).

The connecting holes (315) are respectively formed through the rear arms (312) of the front mounting brackets (31).

The front arms (313) are formed respectively at the front ends of the front mounting brackets (31).

The mounting holes (316) are formed respectively through the front arms (313) of the front mounting brackets (31).

The rear mounting bracket (32) may be H-shaped, is connected pivotally to the front mounting bracket (31) and has two linking arms and an engaging hole (325).

The linking arms are parallel to each other and are connected pivotally to the rear arms (312) and each linking arms has a front end, a rear end, a mounting hole (321), a first fastener (322), a connecting hole (323) and a second fastener (324).

The front ends of the linking arms are connected pivotally to the rear arms (312).

The mounting holes (321) are respectively formed through the front ends of the linking arms and are aligned with the connecting holes (315) of the front mounting brackets (31).

The first fasteners (322) extend through the connecting holes (315) in the front mounting brackets (31) and the mounting holes (321) in the rear mounting bracket (32) to connect the rear mounting bracket (32) with the front mounting brackets (31).

The connecting holes (323) are respectively formed through the rear ends of the linking arms.

The second fasteners (324) extend through the connecting holes (323) in the rear mounting bracket (32).

The engaging hole (325) is formed in one of the linking arms of the rear mounting bracket (32) in front of a corresponding mounting hole (321).

The rear frame (20) is connected pivotally to the mounting bracket assembly (30) and the front frame (10) and has an upper fork (21), a lower fork (22) and two dropouts (23).

The upper fork (21) is connected to the rear mounting bracket (32) and has a top end (211) and two bottom ends (213). The top end (211) is connected pivotally to the linking arms of the rear mounting bracket (32) and has two sides and a pivot hole (212). The pivot hole (212) is formed transversally through the sides of the top end (211) and is aligned with the connecting holes (323) in the rear mounting bracket (32). The second fasteners (324) of the linking arms respectively extend through the connecting holes (323) in the rear mounting bracket (32) and the pivotal hole (212) in the top end (211) to connect the upper fork (21) with the rear mounting bracket (32). The bottom ends (213) are parallel to each other, and each bottom end (213) has a through hole (214). The through holes (214) are respectively formed through the bottom ends (213) and align with each other.

Figure 4:
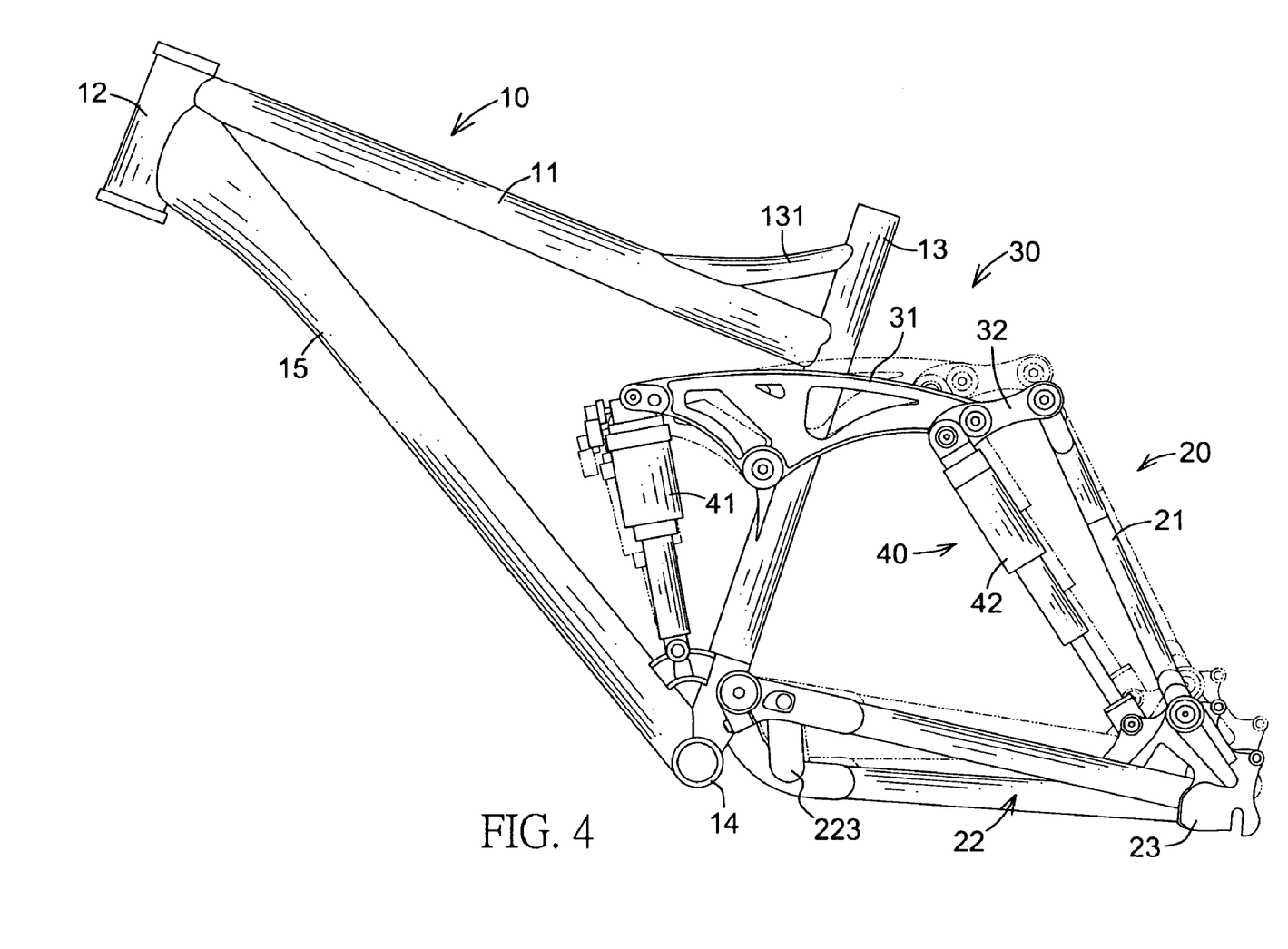
FIG. 4 is an operational side view of the bicycle frame in FIG. 1.
Figure 5:
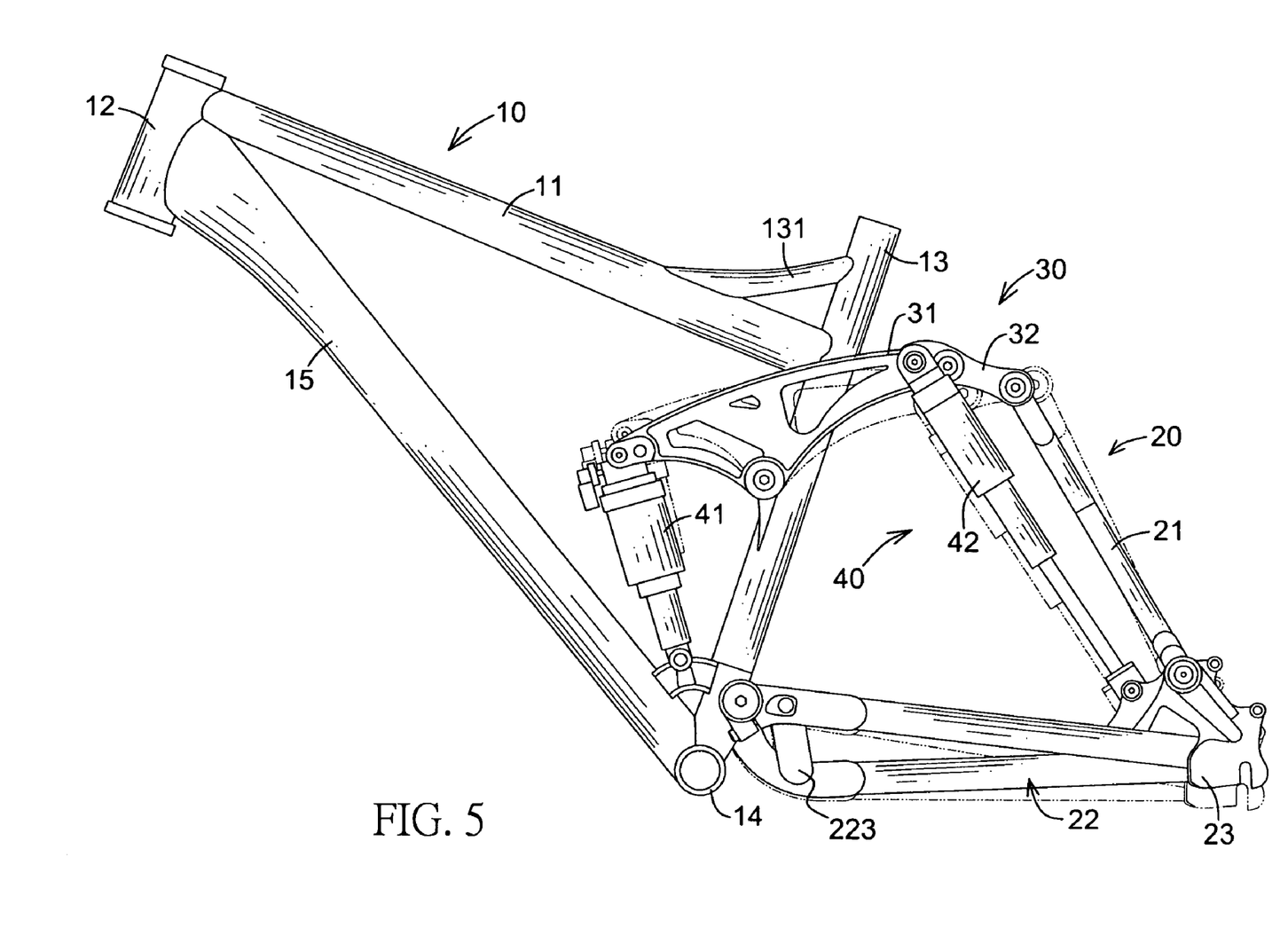
FIG. 5 is another operational side view of the bicycle frame in FIG. 1.

With further reference to FIGS. 4 and 5, application of a shock to the rear frame (20) moves the upper fork (21) and pivots the rear mounting bracket (32) and the front mounting brackets (31) relative to the front frame (10).

The lower fork (22) is connected pivotally to the seat tube (13) and has two chainstays (221) and a cross member (223). The chainstays (221) are parallel to each other and are connected to the lower bracket seat (136) of the seat tube (13), and each chainstay (221) has a front end, a rear end and a pivot hole (222). The pivot holes (222) are formed through the front ends of the chainstays (221) and are aligned with the lower pivot hole (137) in the lower bracket seat (136). The cross member is connected between the front ends of the chainstays (221).

The dropouts (23) are respectively mounted on the rear ends of the chainstays (221) of the lower fork (22) and are connected pivotally to the bottom ends (213) of the upper fork (21), and each dropout (23) has a center hole (231). The center holes (231) are formed through the dropouts (23) and are aligned with the through holes (214) in the bottom ends (213) of the upper fork (21). One of the dropouts (23) has an attaching hole (232) formed in front of the center hole (231), the attaching hole (232) corresponds to the engaging hole (325) of the rear mounting bracket (32).

The shock absorbing device (40) is connected to the front frame (10), the rear frame (20) and mounting bracket assembly (30) and has a first shock absorber (41) and a second shock absorber (42).

The first shock absorber (41) is mounted pivotally between the connecting bracket (134) of the front frame (10) and the front mounting brackets (31) of the mounting bracket assembly (30) and has an upper end, a lower end, a mounting hole (411) and a fastener (412). The upper end of the first shock absorber (41) is attached to the rear arms (313) of the front mounting brackets (31). The mounting hole (411) is formed through the upper end of the first shock absorber (41) and is aligned with the mounting holes (316) of the front mounting brackets (31). The fastener (412) extends through the mounting hole (411) of the first shock absorber (41) and the corresponding mounting holes (316) in the front mounting brackets (31) to connect the first shock absorber (41) with the front mounting brackets (31). The lower end of the first shock absorber (41) is attached pivotally to the connecting holes (135) of the connecting bracket (134).

The second shock absorber (42) is mounted pivotally between the rear mounting bracket (32) of the mounting bracket assembly (30) and one of the dropouts (23) of the rear frame (20) and has an upper end, a lower end, an engaging post (421) and a connecting post (422). The upper end of the second shock absorber (42) is attached to a corresponding linking arm that has the engaging hole (325) of the rear mounting bracket (32). The engaging post (421) is formed on the upper end of the second shock absorber (42) and is engaged with the engaging hole (325) in the rear mounting bracket (32). The lower end of the second shock absorber (42) is attached pivotally to a corresponding dropout (23) that has the attaching hole (232). The connecting post (422) is formed on the lower end of the second shock absorber (42) and is connected to the attaching hole (232) in the corresponding dropout (23). With reference to FIGS. 4 and 5, the shock absorbing device (40) is mounted pivotally between the front frame (10), the rear frame (20) and the mounting bracket assembly (30), a shock applied to the rear frame (20) causes the rear frame (20) to move up. With the movement of the rear frame (20), the rear mounting bracket (32) and the front mounting brackets (31) are pivoted and the shock absorbers (41, 42) are simultaneously compressed to absorb the shock.

The bicycle frame as described has the following advantages.

1. The bicycle frame with the shock absorbing device (40) can provide an excellent shock absorbing capability to fit with all kinds of the rugged and rough grounds with the first shock absorber (41) and the second shock absorber (42).

2. The bicycle frame with the shock absorbing device (40) can improve the shock absorbing capability of the bicycle frame, and this can make a rider riding the bicycle frame safely and comfortably.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A frame for a bicycle having
    a front frame having
        a front;
        a rear;
        a head tube being formed at the front of the front frame;
        a down tube being connected to and protruding at an angle down from the head tube toward the rear of the front frame and having a bottom end;
        a top tube being connected to and protruding from the head tube toward the rear of the front frame and having a rear end;
        a bottom bracket shell being connected transversally to the bottom end of the down tube and having a top; and
        a seat tube being connected to and protruding up from the bottom bracket shell and being connected to the rear end of the top tube and having
            an upper end;
            a lower end;
            an upper bracket seat being formed on and protruding forward from the seat tube;
            a connecting bracket being formed on the seat tube and being connected to the down tube over the bottom bracket shell; and
            a lower bracket seat being formed on and protruding forward from the seat tube between the connecting bracket and the bottom bracket shell;
    a mounting bracket assembly being connected pivotally to the front frame and having
        two front mounting brackets being connected pivotally to the upper bracket seat of the seat tube; and
        a rear mounting bracket being connected pivotally to the front mounting bracket;
    a rear frame being connected pivotally to the mounting bracket assembly and the front frame and having
        an upper fork being connected to the rear mounting bracket and having
            a top end being connected pivotally to the rear mounting bracket; and
            two bottom ends being parallel to each other;
        a lower fork being connected pivotally to the seat tube and having two chainstays parallel to each other and being connected to the lower bracket seat of the seat tube; and
        two dropouts being respectively mounted on the chainstays of the lower fork and being connected pivotally to the bottom ends of the upper fork; and
    a shock absorbing device being connected to the front frame, the rear frame and mounting bracket assembly and having
        a first shock absorber being mounted pivotally between the connecting bracket of the front frame and the front mounting brackets of the mounting bracket assembly; and
        a second shock absorber being mounted pivotally between the rear mounting bracket of the mounting bracket assembly and one of the dropouts of the rear frame.

2. The bicycle frame as claimed in claim 1, wherein each front mounting bracket has
    a front end;
    a rear end;
    a through hole being formed through the front mounting bracket and being aligned with the upper bracket seat;
    a rear arm being formed respectively at the rear end of the front mounting bracket;
    a front arm being formed at the front end of the front mounting bracket; and
    multiple mounting hole.

3. The bicycle frame as claimed in claim 2, wherein
    each front mounting bracket has a connecting hole being formed through the rear arms of the front mounting brackets;
    the rear mounting bracket has two linking arms and each linking arm having
        a front end being connected pivotally to a corresponding rear arm;
        a rear end;
        a mounting hole being formed through the front end of the linking arm and being aligned with the connecting hole of a corresponding front mounting bracket;
        a first fastener being extended through the connecting hole in the corresponding front mounting bracket and the mounting hole in the linking arm;
        a connecting hole being formed through the rear end of the linking arm; and
        a second fastener being extend through the connecting hole in the linking arm; and
    the top end has
        two sides; and
        a pivot hole being formed transversally through the sides of the top end and being aligned with the connecting holes in the rear mounting bracket, and the second fasteners of the linking arms respectively extend through the connecting holes in the rear mounting bracket and the pivotal hole in the top end.

4. The bicycle frame as claimed in claim 3, wherein
    the upper bracket seat has
        two sides; and
        an upper pivot hole being formed transversally through the sides of the upper bracket seat; and
    each front mounting bracket has a fastener being extend through the through holes in the front mounting brackets and the upper pivot hole in the upper bracket seat to connect the front mounting brackets to the seat tube.

5. The bicycle frame as claimed in claim 4, wherein
    the lower bracket seat is formed on and protrudes forward from the seat tube between the connecting bracket and the bottom bracket shell and has
        two sides; and
        a lower pivot hole being formed transversally through the sides of the lower bracket seat; and
    each chainstay of the lower fork has
        a front end;
        a rear end; and a pivot hole being formed through the front end of the chainstay and being aligned with the lower pivot hole in the lower bracket seat.

6. The bicycle frame as claimed in claim 5, wherein
the connecting bracket has
two sides; and
two connecting holes being respectively formed through the sides of the connecting bracket and aligning with each other;
each front mounting bracket has multiple mounting holes being formed through the front arm of the front mounting bracket; and
the first shock absorber has
an upper end being attached to the rear arms of the front mounting brackets;
a lower end being attached pivotally to the connecting holes of the connecting bracket;
a mounting hole being formed through the upper end of the first shock absorber and being aligned with the corresponding mounting holes of the front mounting brackets; and
a fastener being extended through the mounting hole of the first shock absorber and a corresponding mounting holes in the front mounting brackets to connect the first shock absorber with the front mounting brackets.

7. The bicycle frame as claimed in claim 6, wherein
each bottom end of the upper fork has a through hole being formed through the bottom ends and aligning with each other; and
each dropout has a center hole being formed through the dropout and being aligned with the through hole in a corresponding bottom end of the upper fork.

8. The bicycle frame as claimed in claim 7, wherein
the rear mounting bracket has an engaging hole being formed in one of the linking arms of the rear mounting bracket in front of a corresponding mounting hole;
one of the dropouts has an attaching hole being formed in front of the center hole and the attaching hole corresponding to the engaging hole of the rear mounting bracket; and
the second shock absorber has
an upper end being attached to a corresponding linking arm that has the engaging hole of the rear mounting bracket;
a lower end being attached pivotally to a corresponding dropout that has the attaching hole;
an engaging post being formed on the upper end of the second shock absorber and being engaged with the engaging hole in the rear mounting bracket; and
a connecting post being formed on the lower end of the second shock absorber and being connected to the attaching hole in the corresponding dropout.

9. The bicycle frame as claimed in claim 8, wherein the lower fork has a cross member being connected between the front ends of the chainstays.

10. The bicycle frame as claimed in claim 9, wherein the seat tube has a connecting stay formed on and protruding forward from the seat tube near the upper end and connected to the top tube.

11. The bicycle frame as claimed in claim 10, wherein the front mounting brackets are triangular.

12. The bicycle frame as claimed in claim 1, wherein
the lower bracket seat is formed on and protrudes forward from the seat tube between the connecting bracket and the bottom bracket shell and has
two sides; and
a lower pivot hole being formed transversally through the sides of the lower bracket seat; and
each chainstay of the lower fork has
a front end;
a rear end; and
a pivot hole being formed through the front end in the chainstay.

13. The bicycle frame as claimed in claim 1, wherein
the connecting bracket has
two sides; and
two connecting holes being respectively formed through the sides of the connecting bracket and aligning with each other;
each front mounting bracket has multiple mounting holes being formed through the front mounting bracket; and
the first shock absorber has
an upper end being attached to the front mounting brackets;
a lower end being attached pivotally to the connecting holes of the connecting bracket;
a mounting hole being formed through the upper end of the first shock absorber and being aligned with the corresponding mounting holes of the front mounting brackets; and
a fastener being extended through the mounting hole of the first shock absorber and the corresponding mounting holes in the front mounting brackets to connect the first shock absorber with the front mounting brackets.

14. The bicycle frame as claimed in claim 1, wherein
each bottom end of the upper fork has a through hole being formed through the bottom ends and aligning with each other; and
each dropout has a center hole being formed through the dropout and being aligned with the through hole in a corresponding bottom end of the upper fork.

15. The bicycle frame as claimed in claim 1, wherein
the rear mounting bracket has an engaging hole being formed in the rear mounting bracket;
one of the dropouts has an attaching hole corresponding to the engaging hole of the rear mounting bracket; and
the second shock absorber has
an upper end being attached to a corresponding linking arm that has the engaging hole of the rear mounting bracket;
a lower end being attached pivotally to a corresponding dropout that has the attaching hole;
an engaging post being formed on the upper end of the second shock absorber and being engaged with the engaging hole in the rear mounting bracket; and
a connecting post being formed on the lower end of the second shock absorber, and being connected to the attaching hole in the corresponding dropout.

16. The bicycle frame as claimed in claim 1, wherein the lower fork has a cross member being connected between the front ends of the chainstays.

17. The bicycle frame as claimed in claim 1, wherein the seat tube has a connecting stay formed on and protruding forward from the seat tube near the upper end and connected to the top tube.

18. The bicycle frame as claimed in claim 1, wherein the front mounting brackets are triangular.

* * * * *